(12) United States Patent
Lee et al.

(10) Patent No.: US 7,663,310 B2
(45) Date of Patent: Feb. 16, 2010

(54) ORGANIC ELECTRO LUMINESCENCE DISPLAY AND METHOD OF FABRICATING THE SAME

(75) Inventors: Hun-Jung Lee, Annyang-si (KR); Jae-Bon Koo, Yongin-si (KR); Sang-Il Park, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 783 days.

(21) Appl. No.: 10/992,769

(22) Filed: Nov. 22, 2004

(65) Prior Publication Data

US 2005/0116617 A1   Jun. 2, 2005

(30) Foreign Application Priority Data

Nov. 27, 2003   (KR) ................. 10-2003-0085291

(51) Int. Cl.
*H05B 33/22* (2006.01)
(52) U.S. Cl. ..................... 313/509; 313/506
(58) Field of Classification Search ......... 313/498–512; 315/169.3; 345/36, 45, 76
See application file for complete search history.

(56) References Cited

U.S. PATENT DOCUMENTS

| 2003/0193284 A1* | 10/2003 | Park et al. ............ 313/504 |
| 2004/0090173 A1* | 5/2004 | Park et al. ............ 313/500 |
| 2004/0100191 A1* | 5/2004 | Park ..................... 313/506 |

FOREIGN PATENT DOCUMENTS

KR   10-2003-0085239   11/2003

* cited by examiner

*Primary Examiner*—Nimeshkumar D. Patel
*Assistant Examiner*—Christopher M Raabe
(74) *Attorney, Agent, or Firm*—H.C. Park & Associates, PLC

(57) ABSTRACT

An organic electro luminescence (EL) display with low light transmittance material removed from an emission region. The organic EL display comprises a substrate having the emission region and a TFT region. A TFT is formed on the substrate in the TFT region and includes an active layer having source/drain regions, a gate electrode formed on a gate insulating layer, and source/drain electrodes electrically coupled to the source/drain regions. A passivation layer is formed in the TFT region only and it includes a via hole exposing one of the source/drain electrodes. An organic EL element is formed in the emission region and is electrically coupled to one of the source/drain electrodes exposed through the via hole.

13 Claims, 4 Drawing Sheets

ORGANIC ELECTRO LUMINESCENCE DISPLAY AND METHOD OF FABRICATING THE SAME

This application claims the benefit of Korean Patent Application No. 2003-85291, filed Nov. 27, 2003, which is hereby incorporated by reference for all purposes as if fully set forth herein.

BACKGROUND OF THE INVENTION

1. Field of the Invention

The present invention relates to an organic electro luminescence (EL) display and method of fabricating the same and, more particularly, to an organic EL display with high luminous efficiency and method of fabricating the same.

2. Discussion of the Related Art

Generally, an organic EL display emits light when an exciton drops from an excited state to a ground state. An electron injected from an electron injection electrode (cathode) and a hole injected from a hole injection electrode (anode) combine within an emitting layer to create an exciton.

Therefore, unlike a conventional thin film liquid crystal display, the present invention does not require an additional light source, which provides for reduced volume and weight of the device.

Methods for driving the organic EL display may be divided into a passive-matrix type and an active-matrix type.

The configuration and method of fabricating the passive-matrix organic EL display may be simple, but it has high power consumption, and it is difficult to manufacture large, passive matrix displays. Also, because a passive matrix device requires more wiring, its aperture ratio may be smaller.

Therefore, the passive-matrix organic EL display is often used for a smaller display, while the active-matrix organic EL display is typically used for a larger display.

The prior art will now be described with reference to the accompanying drawing.

FIG. 1 is a cross-sectional view illustrating a conventional bottom-emission organic EL display.

Referring to FIG. 1, an active layer 120 made of poly-Si is formed on a buffer layer 110 of an insulating substrate 100.

A gate insulating layer 130 is formed on the active layer 120 and the insulating substrate 100, and a gate electrode 140 is formed on the gate insulating layer 130.

Subsequently, using the gate electrode 140 as a mask, impurities are doped into the active layer 120 to form source/drain regions 121 and 125. A region between the source/drain regions 121 and 125 acts as a channel region 123 of the thin film transistor (TFT).

After forming the source/drain regions 121 and 125, an interlayer insulating layer 150 is formed with contact holes 151 and 155, which expose the source/drain regions 121 and 125. A conductive material is then deposited on the insulating substrate 100 and patterned to form source/drain electrodes 161 and 165, which are electrically coupled to the source/drain regions 121 and 125, thus forming the TFT.

A passivation layer 170, made of SiNx, is formed on the insulating substrate 100 having the TFT, and a planarization layer 180 is formed on the insulating substrate 100 to remove the step of an underlying structure.

Next, a via hole 185 is formed to expose a portion of one of the source/drain electrodes 161, 165. In FIG. 1, the via hole 185 exposes the drain electrode 165.

After forming the via hole 185, an organic EL element 190, electrically coupled to the drain electrode 165 through the via hole 185, is formed.

Here, the organic EL element 190 comprises a first electrode 191, a pixel defining layer 192 having an opening exposing a portion of the first electrode 191, an organic emitting layer 193, and a second electrode 194.

Although not shown in the drawings, the TFT and the organic EL element 190 are then encapsulated using an encapsulation substrate as an upper insulating substrate.

However, the organic EL display formed as described above has a low light transmittance material in a region where light emitted from the organic EL element 190 transmits (emission region). For example, the buffer layer 110 or the passivation layer 170 may be formed of the low light transmittance material. Specifically, when the buffer layer 110 or the passivation layer 170 is made of SiNx, and the SiNx is 6000 Å to 3 μm thick, the light transmittance may be significantly reduced to 75% to 80%, which lowers the luminous efficiency of the organic EL display.

In order to address the above problem, Korean laid-open Patent application No. 2003-0085239 discloses an organic EL display wherein a buffer layer, a gate insulating layer, an interlayer insulating layer and a passivation layer, formed on the emission region of the insulating substrate, are all etched and removed to expose the insulating substrate. However, removing all of the underlying layers of the emission region as disclosed in the above Patent application may form a large step of more than 1.3 μm between the emission region and the non-emission region. Therefore, it may cause an open failure of a pixel electrode formed by sputtering a transparent conductive material, such as indium tin oxide (ITO) and indium zinc oxide (IZO).

Further, forming and removing multiple layers may complicate the fabrication process.

Also, since the pixel electrode is directly formed on the insulating substrate, impurities such as metal ions may diffuse from the insulating substrate 100, thereby penetrating the pixel electrode.

SUMMARY OF THE INVENTION

The present invention provides an organic EL display having improved luminous efficiency by removing a low light transmittance material from an emission region of a pixel unit.

Additional features of the invention will be set forth in the description which follows, and in part will be apparent from the description, or may be learned by practice of the invention.

The present invention discloses an organic EL display, comprising a substrate having an emission region and a TFT region, a TFT formed on the substrate in the TFT region and including an active layer having a source region and a drain region, a gate electrode formed on a gate insulating layer, and a source electrode coupled to the source region and a drain electrode coupled to the drain region. A passivation layer is formed in the TFT region only, and an organic EL element is formed in the emission region. The passivation layer includes a first via hole exposing either the source electrode or the drain electrode, and the organic EL element is electrically coupled to the source electrode or the drain electrode exposed by the first via hole.

The present invention also provides a method of fabricating an organic EL display, comprising forming a TFT, including an active layer, a gate electrode, a source electrode and a drain electrode, on a substrate having an emission region and a TFT region. A passivation layer is formed on the substrate. A first via hole is formed in the passivation layer to expose either the source electrode or the drain electrode, and then the passivation layer is removed from the emission region. An organic EL element is formed in the emission region and electrically coupled to the source electrode or the drain electrode that is exposed by the first via hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Figure 1:
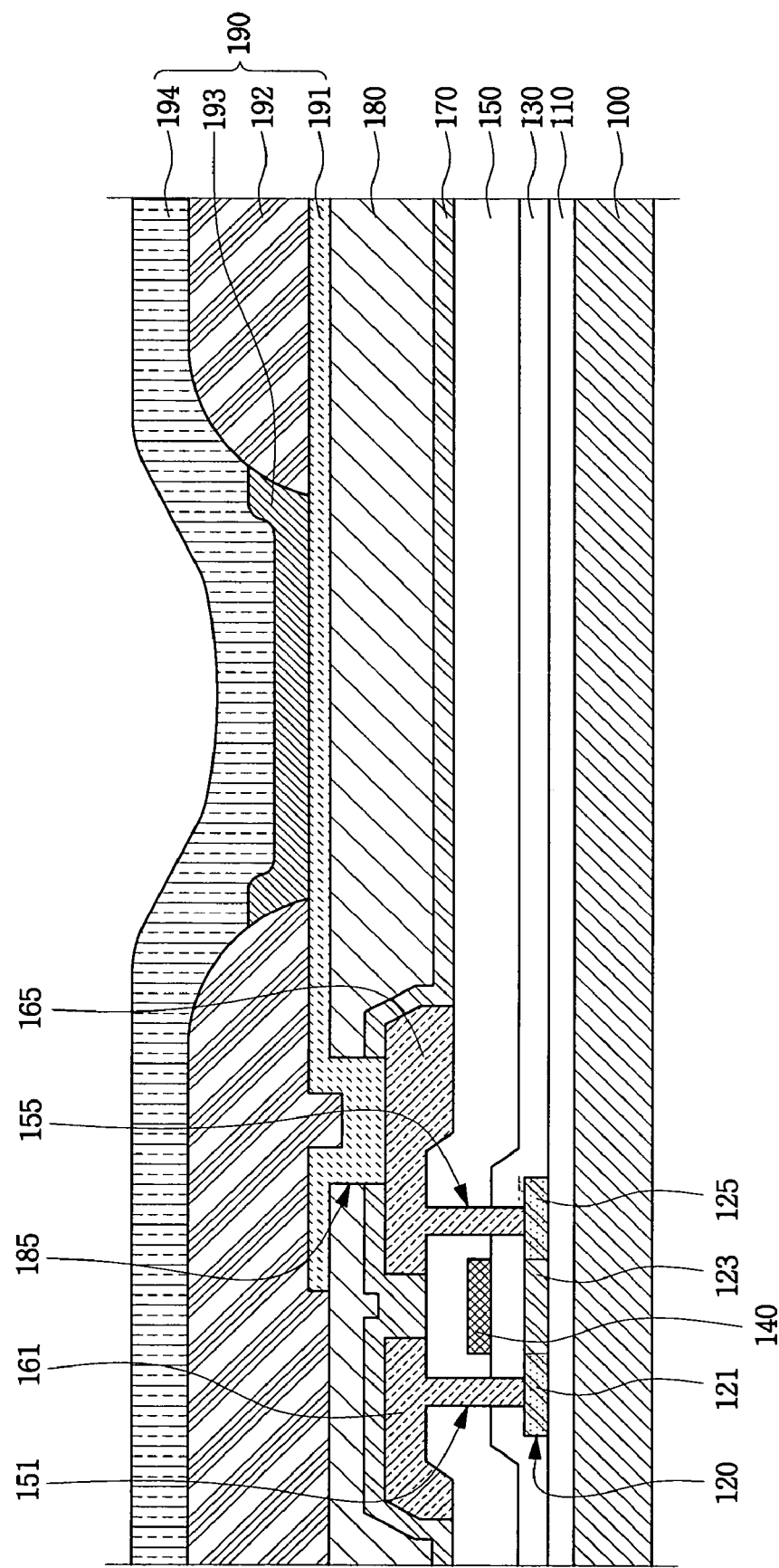
FIG. 1 is a cross-sectional view illustrating a conventional bottom emission organic EL display.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
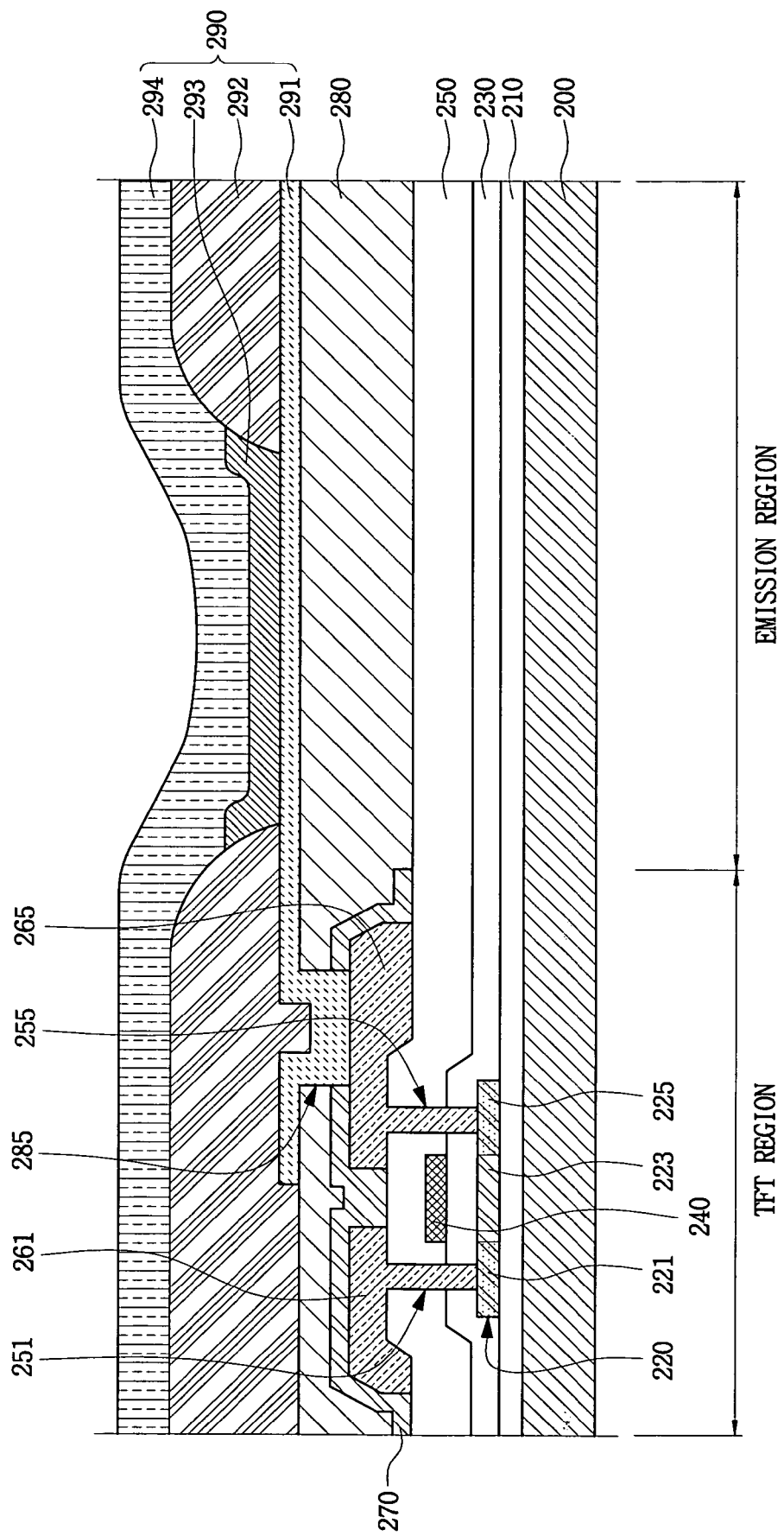
FIG. 2 is a cross-sectional view illustrating an organic EL display according to an exemplary embodiment of the present invention.

FIG. 2 is a cross-sectional view illustrating an organic EL display according to an exemplary embodiment of the present invention.

The organic EL display according to the exemplary embodiment of the present invention has a structure in which the luminous efficiency is improved by removing the low light transmittance material in an emission region.

Referring to FIG. 2, a buffer layer 210 (diffusion barrier) is deposited by plasma enhanced chemical vapor deposition (PECVD), low pressure chemical vapor deposition (LPCVD) and sputtering, or other similar methods, on an insulating substrate 200, which is divided into an emission region and a TFT region. The buffer layer 210 prevents impurities, such as metal ions, from penetrating an active layer 220 (poly-Si).

After forming the buffer layer 210, an amorphous Si layer is deposited by PECVD, LPCVD and sputtering, or other similar method, on the buffer layer 210. A dehydrogenation process may then be performed in a vacuum furnace, but it may not be required when the amorphous Si is deposited by the LPCVD and sputtering.

The amorphous Si is then crystallized to form a poly-Si layer. Preferably, crystallization processes, such as excimer laser annealing (ELA), metal induced crystallization (MIC), metal induced lateral crystallization (MILC), sequential lateral solidification (SLS), and solid phase crystallization (SPC), are used as the above crystallization process.

After forming the poly-Si layer, a photoresist is coated to form the active layer on the poly-Si layer, and the poly-Si layer is patterned to form the active layer 220 using the photoresist as a mask.

After depositing a gate insulating layer 230 made of $SiO_2$ on the active layer 220, and a gate metal on the gate insulating layer 230, the gate metal is patterned to form a gate electrode 240. $SiO_2$ generally has a light transmittance of more than 90%.

After forming the gate electrode 240, impurities are doped into the active layer 220, using the gate electrode 240 as a mask, to form the source/drain regions 121 and 225. A region between the source/drain regions 221 and 225 acts as a channel region 223 of the TFT.

After forming the source/drain regions 121 and 225, an interlayer insulating layer 250 made of $SiO_2$ is formed on the insulating substrate 200 and patterned to form the contact holes 251 and 255, which expose a portion of the source/drain regions 221 and 225.

A conductive layer is then deposited on the insulating substrate 200 and photolithographed to form the source/drain electrodes 261 and 265, which are electrically coupled to the source/drain regions 221 and 225 through the contact holes 251 and 255.

After forming the source/drain electrodes 261, 265, a passivation layer 270, which is about 6,000 Å thick and made of SiNx, is formed on the insulating substrate 200. The light transmittance of the SiNx passivation layer 270 is about 80%.

A heat treatment may then be performed to improve the characteristics of the TFT by curing damages generated during its fabrication.

After heat treating, the passivation layer 270 is removed from the emission region.

This may improve the luminous efficiency of the organic EL display because SiNx has a low light transmittance.

After removing the passivation layer 270, a planarization layer 280 is formed on the substrate in order to remove a step of the underlying structure. It is desirable to use a fluid material, such as Acryl, polymide (PI), polyamide (PA) or Benzocyclobutene (BCB), as the planarization layer 280.

A via hole 285 is formed in the planarization layer 280 and the passivation layer 270 to expose a portion of one of the source/drain electrodes 261 and 265. FIG. 2 shows the via hole 285 exposing the drain electrode 265.

An organic EL element 290 is electrically coupled to the drain electrode 265 through the via hole 285.

The organic EL element 290 comprises a lower electrode 291, a pixel defining layer 292 having an opening exposing a portion of the lower electrode 291, an organic emitting layer 293 formed on a portion of the lower electrode 291 exposed by the opening, and an upper electrode 294.

The organic emitting layer 293 may also include a hole injection layer (HIL), a hole transport layer (HLT), a hole blocking layer (HBL), an electron transport layer (ETL), and an electron injection layer (EIL).

Though not shown in the drawings, the organic EL element 290 is encapsulated using an upper substrate.

Alternatively, the buffer layer 210 may be formed as a double buffer layer having a first buffer layer made of SiNx and a second buffer layer made of $SiO_2$. Since the SiNx buffer layer has low light transmittance, the organic EL display is formed by removing the SiNx from the emission region and then fabricating the organic EL display as described above.

Figure 3:
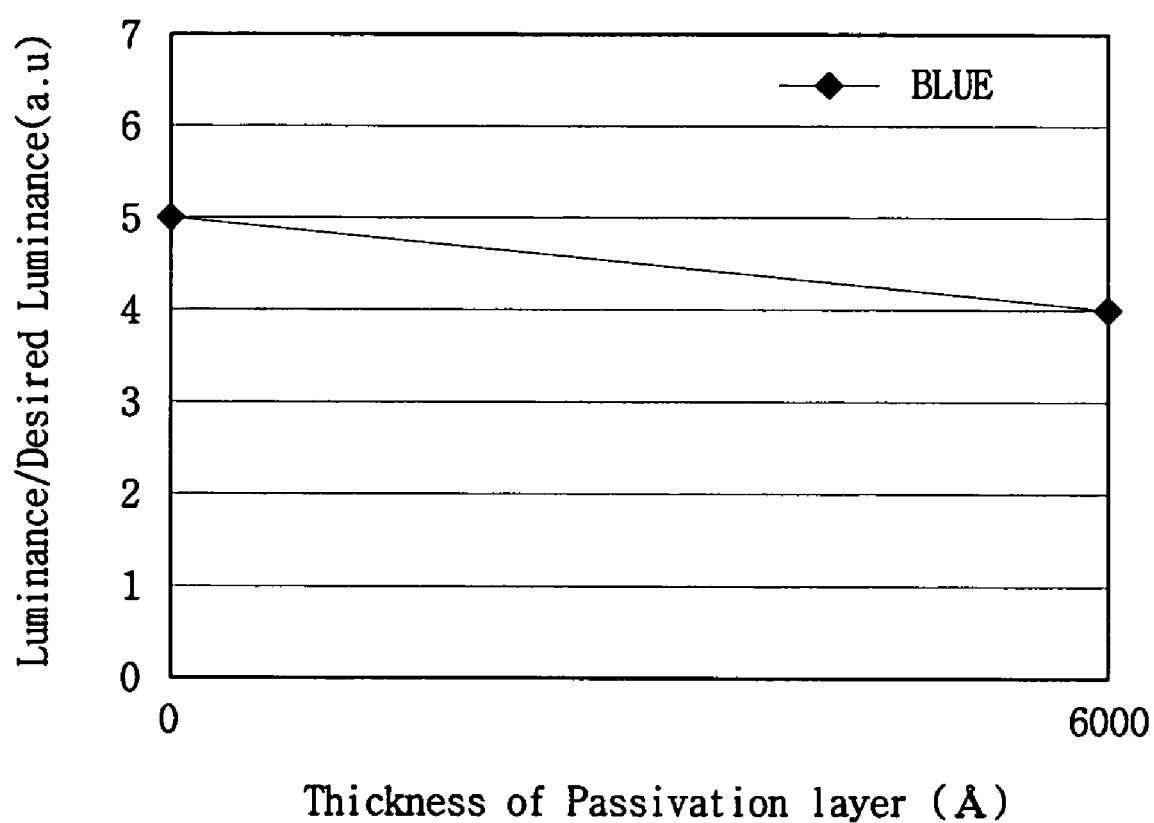
FIG. 3 shows a change of luminance/desired luminance according to SiNx thickness.

FIG. 3 shows a change of luminance/desired luminance according to the thickness of a SiNx passivation layer, which has low light transmittance.

In the case of a blue organic EL element, FIG. 3 shows that the luminance/desired luminance when there is no SiNx layer on the underlying structure is 25% greater than when there is a 6,000 Å thick SiNx layer.

Therefore, when low light transmittance material, such as SiNx, is removed from the emission region, the luminance of the organic EL display may be enhanced.

Figure 4:
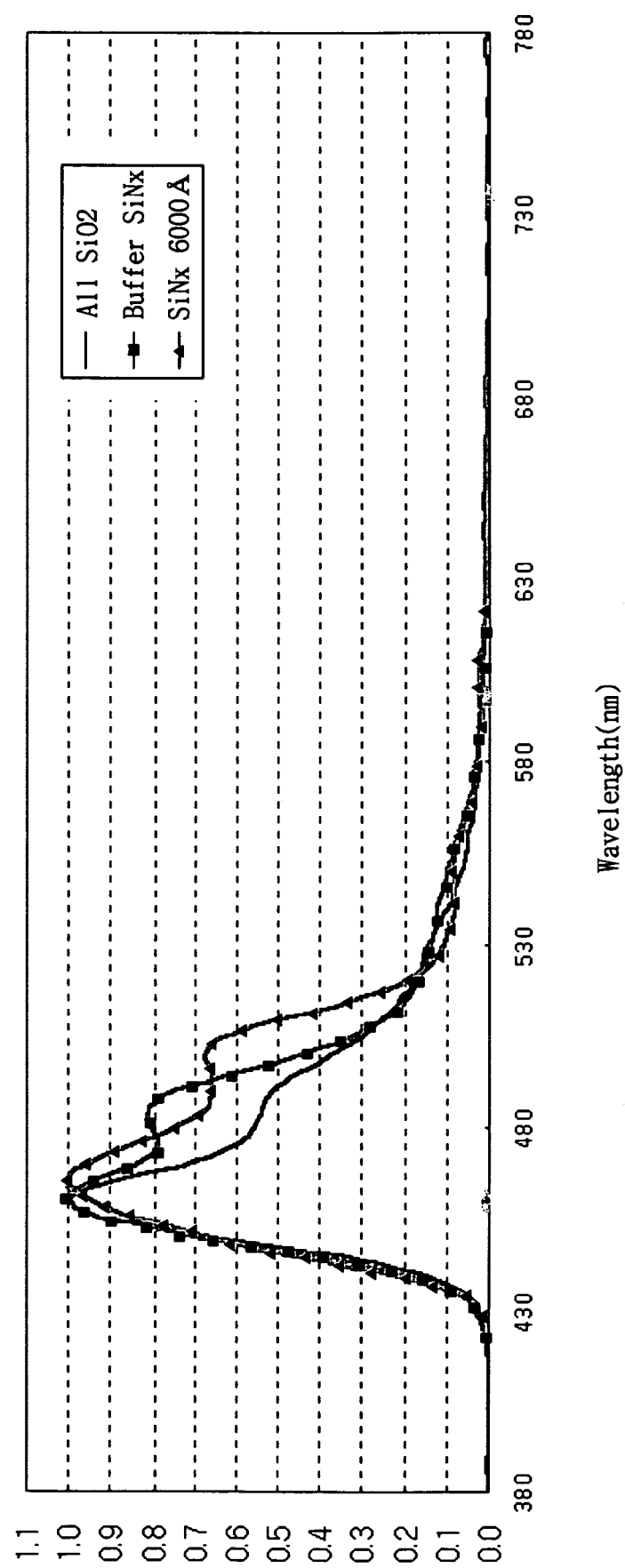
FIG. 4 shows a spectrum change according to the presence of the SiNx layer.

FIG. 4 shows a spectrum change according to the existence of a SiNx layer.

Referring to FIG. 4, in the case of a blue organic EL element, the different spectrum waveforms show cases when there is no SiNx layer on the underlying structure of the organic emitting layer, when there is a SiNx layer on the buffer layer of the underlying structure, and when a 6,000 Å thick SiNx layer is formed on the passivation layer and buffer layer of the underlying structure.

While the presence of a low light transmittance material, such as SiNx, on the underlying structure may distort the spectrum waveform, the spectrum waveform may be smooth when such material does not exist.

Therefore, considering that smooth spectrum waveforms may provide good luminance uniformity, luminance uniformity of the EL element may be improved by removing low light transmittance material, such as SiNx.

The organic EL display as described above may have improved luminous efficiency and luminance uniformity by removing the low light transmittance material, such as SiNx, in the emission region.

In other words, when the emission region of the pixel unit is formed with material having a light transmittance above a certain value, the luminous efficiency and luminance uniformity may be enhanced.

Further, according to an exemplary embodiment of the present invention, after patterning the passivation layer 270, the planarization layer 280 is formed in order to remove the step of the underlying structure, and the organic EL element 290 is electrically coupled to the TFT by the via hole 285. However, instead of forming the planarization layer 280, the passivation layer 270 may be formed and patterned to form a via hole exposing a portion of one of source/drain electrodes 261 and 265. At the same time, the passivation layer 270 is removed from the emission region, thereby enhancing the luminous efficiency and luminance uniformity of the organic EL display.

According to exemplary embodiments of the present invention as described above, low light transmittance material is removed from the emission region of the pixel unit in the organic EL display, thereby providing the organic EL display with improved luminous efficiency and luminance uniformity.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electro luminescence (EL) display, comprising:
   a substrate having an emission region and a thin film transistor (TFT) region;
   a TFT formed on the substrate in the TFT region and including:
     an active layer having a source region and a drain region;
     a gate electrode formed on a gate insulating layer; and
     a source electrode coupled to the source region and a drain electrode coupled to the drain region;
   a passivation layer formed in the TFT region only; and
   an organic EL element formed in the emission region,
   wherein the passivation layer includes a first via hole exposing either the source electrode or the drain electrode;
   wherein the organic EL element is electrically coupled to the source electrode or the drain electrode exposed by the first via hole.

2. An organic electro luminescence (EL) display, comprising:
   a substrate having an emission region and a thin film transistor (TFT) region;
   a TFT formed on the substrate in the TFT region and including:
     an active layer having a source region and a drain region;
     a gate electrode formed on a gate insulating layer; and
     a source electrode coupled to the source region and a drain electrode coupled to the drain region;
   a passivation layer formed in the TFT region only;
   a planarization layer formed on the substrate including the passivation layer; and
   an organic EL element formed in the emission region,
   wherein the passivation layer includes a first via hole exposing either the source electrode or the drain electrode,
   wherein the organic EL element is electrically coupled to the source electrode or the drain electrode exposed by the first via hole, and
   wherein the planarization layer has a second via hole exposing the source electrode or the drain electrode exposed by the first via hole.

3. The organic EL display of claim 1, wherein the passivation layer is made of a material having a light transmittance of less than 80%.

4. The organic EL display of claim 1, wherein the passivation layer is made of SiNx.

5. The organic EL display of claim 1, further comprising:
   a buffer layer interposed between the substrate and the active layer;
   wherein the buffer layer includes:
     a first buffer layer formed in the TFT region only; and
     a second buffer layer formed on the substrate including the first buffer layer.

6. The organic EL display of claim 5,
   wherein the first buffer layer is made of a material having a light transmittance that is less than 80%, and
   wherein the second buffer layer is made of a material having a light transmittance that is greater than 90%.

7. The organic EL display of claim 5,
   wherein the first buffer layer is made of SiNx, and
   wherein the second buffer layer is made of $SiO_2$.

8. The organic EL display of claim 1, further comprising an interlayer insulating layer formed directly on the gate electrode,
   wherein a lower surface of the source electrode and a lower surface of the drain electrode are formed directly on the interlayer insulating layer, and
   wherein the passivation layer is formed directly on an upper surface of the source electrode and an upper surface of the drain electrode.

9. The organic EL display of claim 1, wherein the first via hole exposes a top surface of either the source electrode or the drain electrode.

10. The organic EL display of claim 1, further comprising an interlayer insulating layer formed directly on the gate electrode,
  wherein the passivation layer is formed directly on the source electrode and the drain electrode and is separated from the gate electrode by the interlayer insulating layer.

11. The organic EL display of claim 1, wherein no part of either the source electrode or the drain electrode is disposed in the first via hole.

12. The organic EL display of claim 1, further comprising a pixel electrode connected to either the source electrode or the drain electrode through the first via hole, the pixel electrode filling the first via hole.

13. The organic EL display of claim 1, wherein the source electrode and the drain electrode each comprise a first side facing the substrate and a second side opposite the first side, and
  wherein the first via hole exposes either the second side of the source electrode or the second side of the drain electrode.

* * * * *

UNITED STATES PATENT AND TRADEMARK OFFICE
CERTIFICATE OF CORRECTION

PATENT NO.         : 7,663,310 B2
APPLICATION NO. : 10/992769
DATED              : February 16, 2010
INVENTOR(S)        : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1103 days.

Signed and Sealed this

Thirtieth Day of November, 2010

David J. Kappos
*Director of the United States Patent and Trademark Office*